(12) United States Patent
Maeshima

(10) Patent No.: US 6,873,922 B2
(45) Date of Patent: Mar. 29, 2005

(54) TRANSIENT RESPONSE ANALYSIS PROGRAM OF CAPACITOR, RECORDING MEDIUM, METHOD OF ANALYSIS, AND SIMULATOR

(75) Inventor: Hiroyuki Maeshima, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/490,263

(22) PCT Filed: Jul. 25, 2003

(86) PCT No.: PCT/JP03/09441

§ 371 (c)(1),
(2), (4) Date: Mar. 22, 2004

(87) PCT Pub. No.: WO2004/011931

PCT Pub. Date: Feb. 5, 2004

(65) Prior Publication Data

US 2004/0249603 A1 Dec. 9, 2004

(30) Foreign Application Priority Data

Jul. 31, 2002 (JP) .................................. 2002-222789

(51) Int. Cl.[7] .............................................. G06F 19/00
(52) U.S. Cl. ........................................ 702/65; 324/658
(58) Field of Search ............................. 702/65, 38, 57, 702/60, 64, 66, 182; 324/519, 658

(56) References Cited

U.S. PATENT DOCUMENTS 6,741,413 B2 * 5/2004 Ohlson ........................ 360/66
2003/0192542 A1 * 10/2003 Isaza ..................... 128/204.18

OTHER PUBLICATIONS

English translation of International Search Report for PCT/JP03/09441, dated Nov. 18, 2003.
Maejima et al., "Condenser no Koseido Toka Kairo Model", 2000 Nen The Institute of Electronics, Information and Communication Engineers Sogo Taikai Koen Ronbunshu, Mar. 2000, Electronics 2, p. 16.

* cited by examiner

Primary Examiner—Edward Raymond
(74) Attorney, Agent, or Firm—RatnerPrestia

(57) ABSTRACT

A transient response analysis program of a capacitor is used for making a computer execute a transient response analysis of the capacitor having impedance in a positive frequency region. This program includes at least nine steps, especially estimates impedances at zero frequency from respective impedances in positive and negative frequency regions, and reflects the result on the transient response analysis.

16 Claims, 5 Drawing Sheets

TRANSIENT RESPONSE ANALYSIS PROGRAM OF CAPACITOR, RECORDING MEDIUM, METHOD OF ANALYSIS, AND SIMULATOR

This application is a U.S. National Phase Application of PCT International Application PCT/3P03/09441.

TECHNICAL FIELD

The present invention relates to a transient response analysis technology of a capacitor, and more specifically to a program for making a computer execute a transient response analysis of the capacitor.

BACKGROUND ART

Speed and frequency of information communication equipment have recently been increased, and hence electronic circuits including a passive element used in it have increased in complexity. Therefore, in designing the electronic circuits, a highly accurate circuit simulation in a time region of the electronic circuits, namely a transient response analysis, is important.

Electric characteristics of these complex electronic circuits are difficult to be predicted in the designing stage of a circuit diagram. The following process is therefore, generally performed. A prototype of an electronic circuit is produced, its electric characteristic is measured, and, when the electric characteristic is not a desired one, the electronic circuit is redesigned. For speeding up this process, a circuit simulation for predicting the electric characteristic of the electronic circuit has been performed using a computer and software.

A typical example of the software is SPICE (Simulation Program with Integrated Circuit Emphasis) developed in University of California. The SPICE simulates the electric characteristic using an equivalent circuit model of the electronic circuit which is derived by reproducing a transfer function in a frequency region. This method has high accuracy, but the derivation of the equivalent circuit model is disadvantageously complicated.

While, in a conventional method of the transient response analysis using no equivalent circuit model, the transfer function is inversely Fourier-transformed to provide an impulse response, and a response signal is determined by convolution of the impulse response and an input signal.

FIG. 7 shows a procedure of this conventional method. A capacitor is used as the passive element, and impedance is used as the transfer function.

Firstly, impedance of a frequency region is provided, namely is input, in first step 71. This impedance is a value measured by a measuring apparatus such as an inductance-capacitance-resistance (LCR) meter.

Then, the input impedance is inversely Fourier-transformed to provide an impulse response in second step 72. The impedance is transformed from a value in the frequency region to a value in a time region.

A current value in the time region is then provided as an input signal in third step 73. Namely, an appropriate current value is input.

The impulse response and the current value are then convoluted to provide a voltage value as a response signal in fourth step 74.

The transient response analysis is performed in these steps.

This method can advantageously omit labor of the derivation of the equivalent circuit model. However, the analyzing accuracy depends on the accuracy of the transfer function and the size of the concerned frequency region, so that sufficient accuracy cannot be obtained when a capacitor is used as the passive element.

The absolute value of the imaginary part of the impedance of the capacitor disperses inversely proportionally to frequency, so that it is difficult to measure an impedance at zero frequency that has a large effect on an analysis result. Therefore, sufficient analyzing accuracy cannot be obtained.

DISCLOSURE OF THE INVENTION

The present invention provides a program for making a computer execute a transient response analysis of a capacitor having an impedance in a positive frequency region. The transient response analysis of the capacitor is performed by at least the following steps. In the first step, impedance every positive sample frequency expressed by $$Z(f_n) = R(f_n) + jX(f_n) \tag{1}$$

is input. Where, Z is an impedance, R is the real part of Z, X is the imaginary part of Z, j is imaginary unit, n ($1 \leq n \leq N$) is an integer, and $f_n$ ($f_n = nf_N/N$) is a sample frequency. In the second step, impedance every negative sample frequency expressed by $$Z(f_{-n}) = R(f_n) - jX(f_n) \tag{2}$$

is generated. In the third step, for impulse response every sample time expressed by $$Z(t_m) = z_R(t_m) + z_X(t_m) \tag{3}$$

where, z is an impulse response of Z, $z_R$ is an impulse response of R, $z_X$ is an impulse response of X, m ($0 \leq m \leq N$) is an integer, and $t_m$ ($t_m = m/2f_N$) is a sample time, and for capacitance at the lowest sample frequency expressed by $$\tilde{C}_0 = \frac{-1}{2\pi f_1 X(f_1)}, \tag{4}$$

capacitance $C_0$ is set to equal to $\tilde{C}_0$ or at least to satisfy $$0.9 \times \tilde{C}_0 \leq C_0 \leq 1.1 \times \tilde{C}_0. \tag{5}$$

In the fourth step, an impulse response of X every sample time expressed by $$z_X(t_m) = \frac{m}{4NC_0 f_N} - \frac{1}{2N} \sum_{\substack{n=-N \\ n \neq 0}}^{N-1} X\left(\frac{nf_N}{N}\right) \sin\left(\frac{\pi m n}{N}\right) \tag{6}$$

is generated. In the fifth step, for an extrapolated value of the real part of the impedance at zero frequency expressed by $$\tilde{R}_0 = \frac{f_2 R(f_1) - f_1 R(f_2)}{f_2 - f_1}, \tag{7}$$

direct-current resistance $R_0$ is set to be equal to $\tilde{R}_0$ at least to satisfy $$0.9 \times \tilde{R}_0 \leq R_0 \leq 1.1 \times \tilde{R}_0. \tag{8}$$

In the sixth step, an impulse response of R every sample time expressed by $$z_R(t_m) = \frac{R_0}{2N} + \frac{1}{2N} \sum_{\substack{n=-N \\ n \neq 0}}^{N-1} R\left(\frac{nf_N}{N}\right) \cos\left(\frac{\pi mn}{N}\right) \tag{9}$$

is generated. In the seventh step, an input current every sample time expressed by $$i(t_m) \tag{10}$$

is input. In the eighth step, a response voltage every sample time expressed by $$v(t_m) = \sum_{m'=-N}^{N-1} z\left(\frac{m'}{2f_N}\right) i\left(\frac{m-m'}{2f_N}\right) \tag{11}$$

is generated. In the ninth step, at least part of data obtained using Eq. 1 to Eq. 11 is output.

DETAILED DESCRIPTION OF PREFERRED EMBODIMENTS

Exemplary Embodiment

A transient response analysis of a capacitor in accordance with an exemplary embodiment of the present invention will be hereinafter described with reference to drawings.

Figure 1:
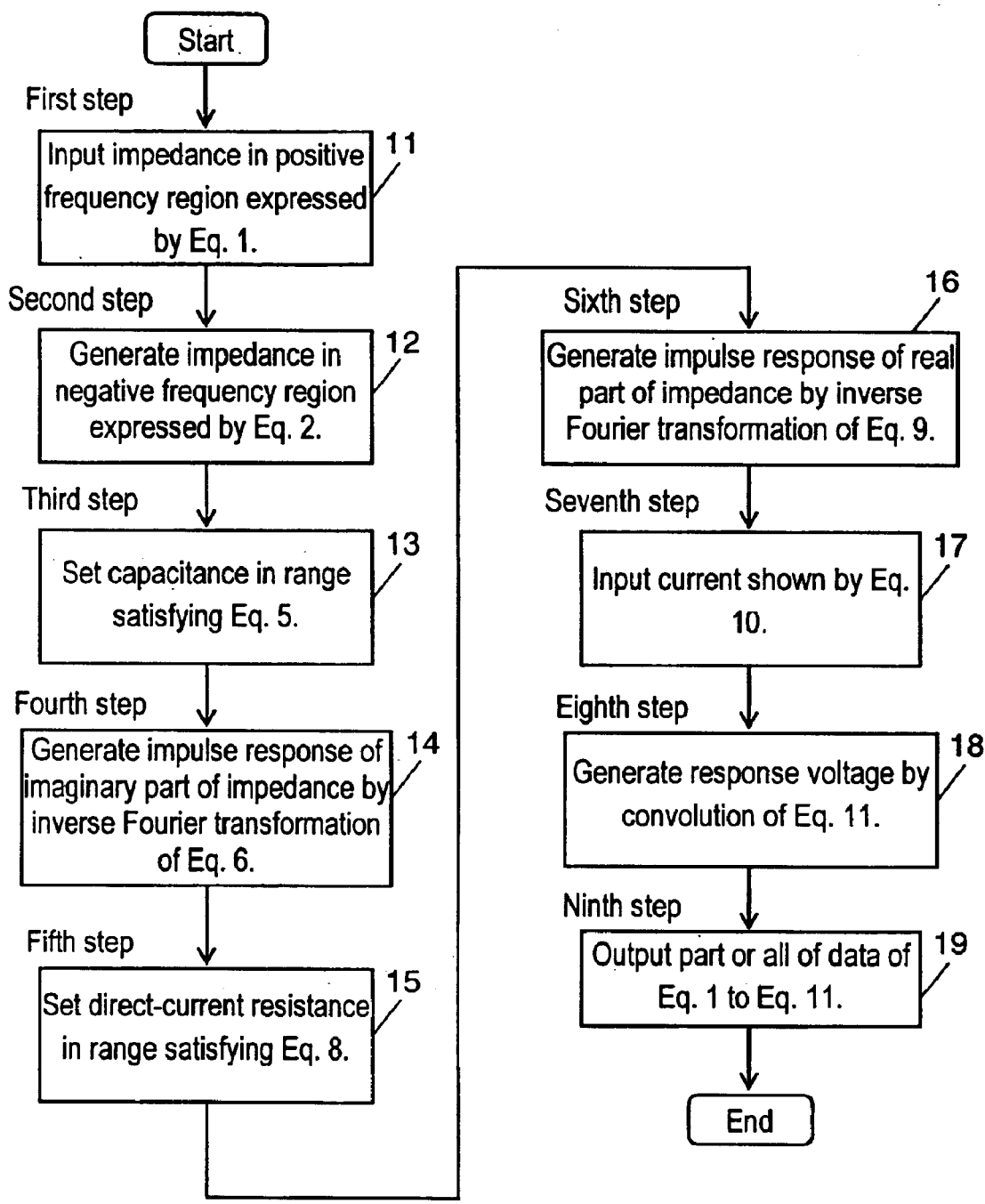
FIG. 1 is a processing flow chart in accordance with an exemplary embodiment of the present invention.

FIG. 1 is a processing flow of the transient response analysis of a capacitor in accordance with an exemplary embodiment of the present invention. In first step 11 of FIG. 1, impedance every positive sample frequency expressed by Eq. 1 is input.

In second step 12, impedance every negative sample frequency expressed by Eq. 2 based on the input data is generated. Real part R of the impedance is set as an even function and imaginary part X of the impedance is set as an odd function as in Eq. 2, so that an impulse response of the capacitor shown in Eq. 3 is obtained as a real number.

In third step 13, capacitance is set in a range satisfying Eq. 5 for capacitance at the lowest sample frequency expressed by Eq. 4. Capacitance $C_0$ is set to equal to $\tilde{C}_0$ or at least to satisfy Eq. 5. Capacitance $C_0$ is required for generating an impulse response of the imaginary part of the impedance in the next, fourth step, so that capacitance $C_0$ is previously set in the third step. Eq. 5 shows that a value employed as a capacitance at the lowest sample frequency can have a tolerance up to ±10% of the capacitance at the lowest sample frequency. When a value exceeding this range is employed as the capacitance at the lowest sample frequency, the analyzing accuracy of the final result largely decreases. Therefore, the value in this range is employed.

In fourth step 14, an impulse response of the imaginary part of the impedance is generated by inverse Fourier transformation shown in Eq. 6. The first term in the right-hand side of Eq. 6 shows a contribution of the imaginary part of the impedance to the impulse response at the limit frequency of zero. The impulse response of the imaginary part of the impedance at the limit frequency of zero is difficult to be measured, so that the contribution is determined by the following method.

Assuming that the capacitor has capacitance $C_0$ at a low-frequency region, and when n is extended from an integer to a real number and the limit provided in making n approach 0 from the right side is expressed by n→+0, $$\lim_{n \to +0} X(f_n) = \lim_{n \to +0} \frac{-N}{2\pi n f_N C_0} \tag{19}$$

is obtained. Using Eq. 19, $$\lim_{n \to +0} \frac{-1}{2N} X\left(\frac{nf_N}{N}\right) \sin\left(\frac{\pi mn}{N}\right) = \lim_{n \to +0} \frac{m}{4NC_0 f_N} \frac{\sin(\pi mn/N)}{\pi mn/N} = \frac{m}{4NC_0 f_n} \tag{20}$$

is derived.

In fifth step 15, direct-current resistance $R_0$ satisfying Eq. 8 is set for the extrapolated value of the real part of the impedance at zero frequency expressed by Eq. 7. Direct-current resistance $R_0$ is set to equal to $\tilde{R}_0$ or at least to satisfy $$0.9 \times \tilde{R}_0 \leq R_0 \leq 1.1 \times \tilde{R}_0. \tag{21}$$

Direct-current resistance $R_0$ is required for generating an impulse response of the real part of the impedance in the next, sixth step, so that direct-current resistance $R_0$ is previously set in the fifth step. Eq. 21 shows that a value employed as a direct-current resistance at the lowest sample frequency can have a tolerance up to ±10% of the direct-current resistance at the lowest sample frequency. When a value exceeding this range is employed as the direct-current resistance at the lowest sample frequency, the analyzing accuracy of the final result largely decreases. Therefore, the value in this range is employed.

In sixth step 16, an impulse response of the real part of the impedance expressed by Eq. 9 is generated. The impulse response of R every sample time is generated by inverse Fourier transformation expressed by $$z_R(t_m) = \frac{R_0}{2N} + \frac{1}{2N} \sum_{\substack{n=-N \\ n \neq 0}}^{N-1} R\left(\frac{nf_N}{N}\right) \cos\left(\frac{\pi mn}{N}\right). \tag{22}$$

The first term in the right-hand side of Eq. 22 shows a contribution of the real part of the impedance to the impulse response at the limit frequency of zero. The impulse response of the real part at the limit frequency of zero is difficult to be measured.

In seventh step 17, an input current expressed by Eq. 10 is fed into the capacitor.

In eighth step 18, a response voltage of the capacitor expressed by Eq. 11 is generated by convolution. The response voltage every sample time expressed by Eq. 11 is generated by convolution of the impulse responses in Eq. 6 and Eq. 22 and the input current in Eq. 10.

In ninth step 19, part or all of data obtained using Eq. 1 to Eq. 11 is output.

Figure 2A:
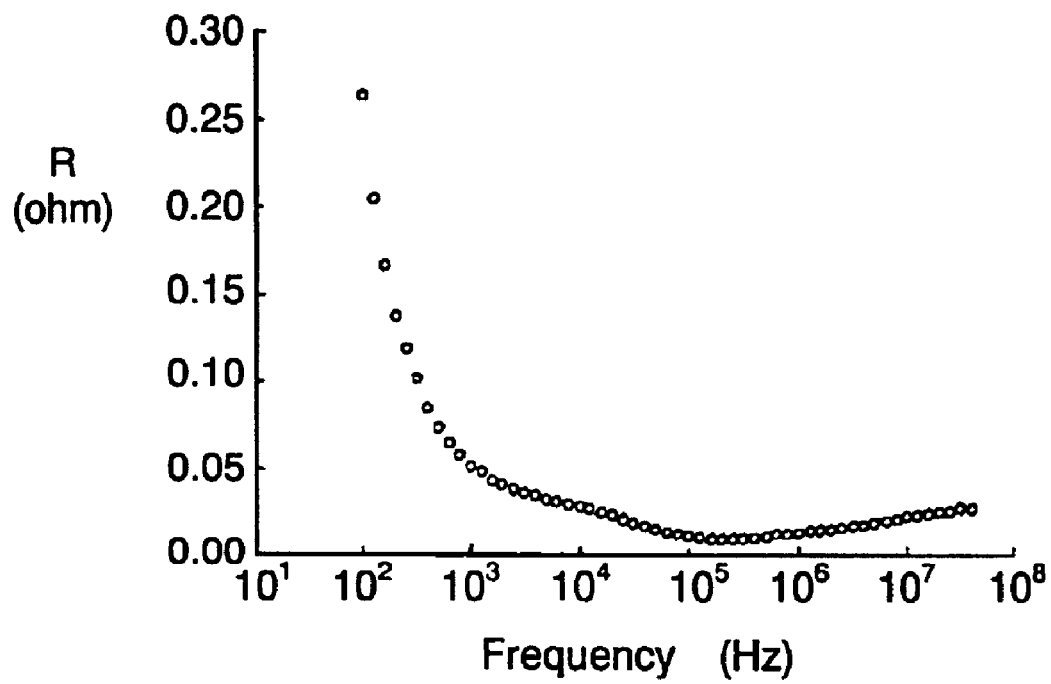
FIG. 2A is a characteristic diagram of the real part of impedance of a capacitor.
Figure 2B:
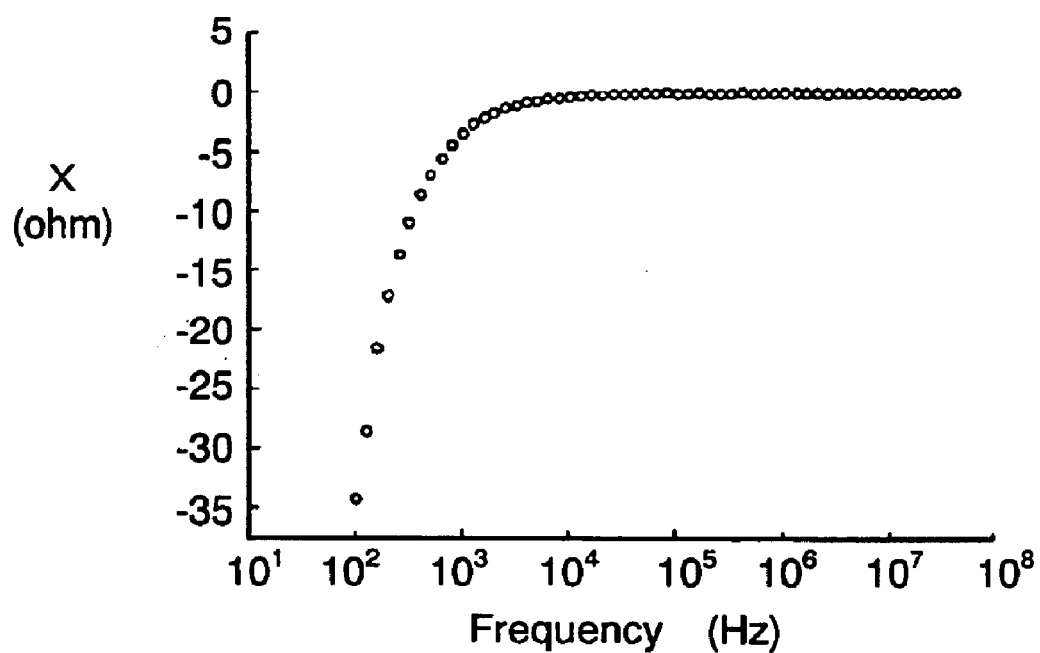
FIG. 2B is a characteristic diagram of the imaginary part of the impedance of the capacitor.

In the first step, the real part and the imaginary part of the impedance of an aluminum solid electrolytic capacitor provided in the positive frequency region shown in FIG. 2A and FIG. 2B are input. As the frequency approaches 0 from the positive side, the absolute values of the real part and the imaginary part of the impedance increase. At the limit frequency of zero, measurement is difficult and hence impedance is not provided.

In the second step, the real part and the imaginary part of the impedance in the negative frequency region expressed by Eq. 2 are generated. The real part becomes an even function, the imaginary part becomes an odd function, and an impulse response (Eq. 3) derived by inversely Fourier-transforming the impedance becomes a real number.

In the third step, a capacitance at the lowest sample frequency shown in Eq. 4 is estimated at $$\tilde{C}_0 = \frac{-1}{2\pi \times 100.0 \times (-34.24)} = 4.65 \times 10^{-6} [F], \tag{23}$$

and $$C_0 = 4.65 \times 10^{-6} [F] \tag{24}$$

is set so as to satisfy Eq. 5.

In the fourth step, impulse response $z_x(t_m)$ of imaginary part X of the impedance every sample time is generated using Eq. 6.

In the fifth step, $f_{N'}$ satisfying $$X(f_{N'}) \leq 0 < X(f_{N'+1}) \tag{13}$$

is estimated at $$f_{6309} = 630900.0 [Hz]. \tag{25}$$

Figure 3:
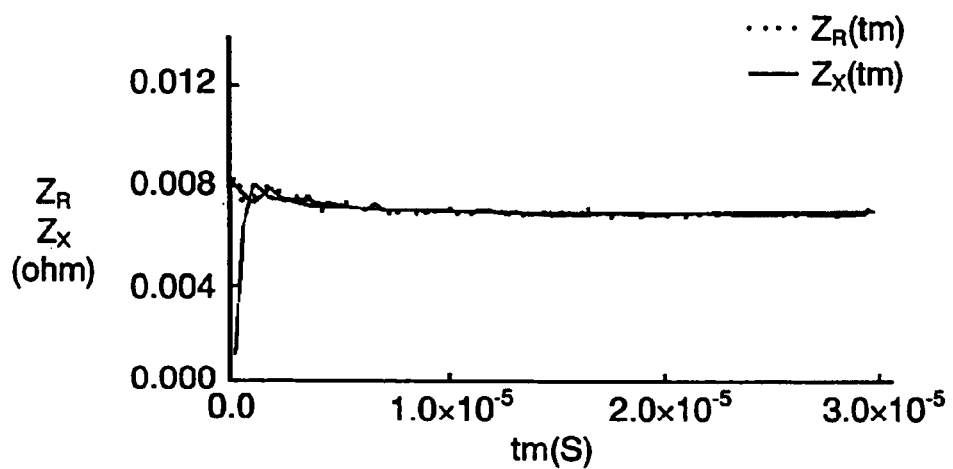
FIG. 3 is a diagram of $z_R(t_m)$ and $z_X(t_m)$ in accordance with the exemplary embodiment.

Direct-current resistance $R_0$ is set at $$R_0 = 7.6 \times 10^2 [\Omega] \tag{26}$$

so that $z_x(t_m)$ in $$z_x(t_m) = \frac{m}{4N'C_0 f_{N'}} - \frac{1}{2N'} \sum_{\substack{n=-N'\\n\neq 0}}^{N'-1} X\left(\frac{nf_{N'}}{N'}\right) \sin\left(\frac{\pi mn}{N'}\right) \tag{14}$$

and $z_R(t_m)$ in $$z_R(t_m) = \frac{R_0}{2N'} + \frac{1}{2N'} \sum_{\substack{n=-N'\\n\neq 0}}^{N'-1} R\left(\frac{nf_{N'}}{N'}\right) \cos\left(\frac{\pi mn}{N'}\right) \tag{15}$$

satisfy $$0.9 \times z_x(t_m) \leq z_R(t_m) \leq 1.1 \times z_x(t_m), \tag{12}$$

for m satisfying m≠0 and $|m| \leq 6309$. FIG. 3 shows the state where $z_x(t_m)$ in Eq. 14 and $z_R(t_m)$ in Eq. 15 satisfy Eq. 12 for $R_0$ in Eq. 26 and m satisfying m≠0 and $|m| \leq 6309$.

In the sixth step, impulse response $z_R(t_m)$ of real part R of the impedance every sample time is generated using Eq. 9.

Figure 4:
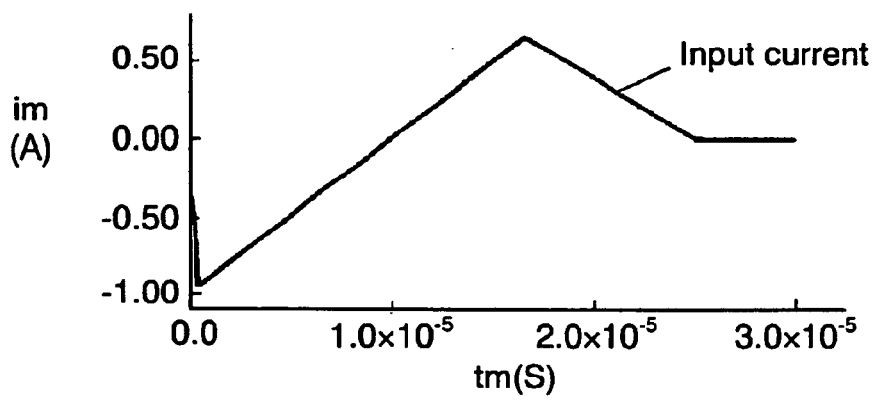
FIG. 4 is a diagram of input current in accordance with the exemplary embodiment.

In the seventh step, input current $i(t_m)$ expressed by Eq. 10 is input. Here, the input current shown in FIG. 4 is assumed.

Figure 5:
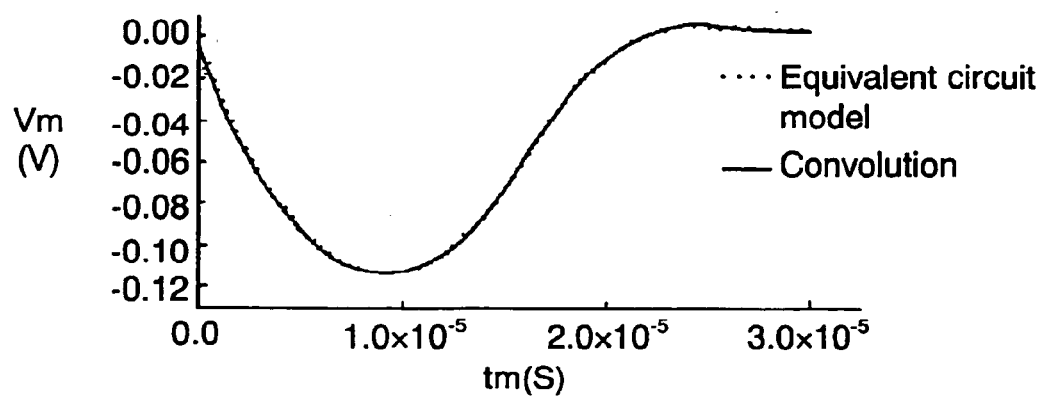
FIG. 5 is a diagram of response voltage in accordance with the exemplary embodiment.

In the eighth step, response voltage $v(t_m)$ is generated using Eq. 11. FIG. 5 shows the result of the voltage.

Figure 6A:
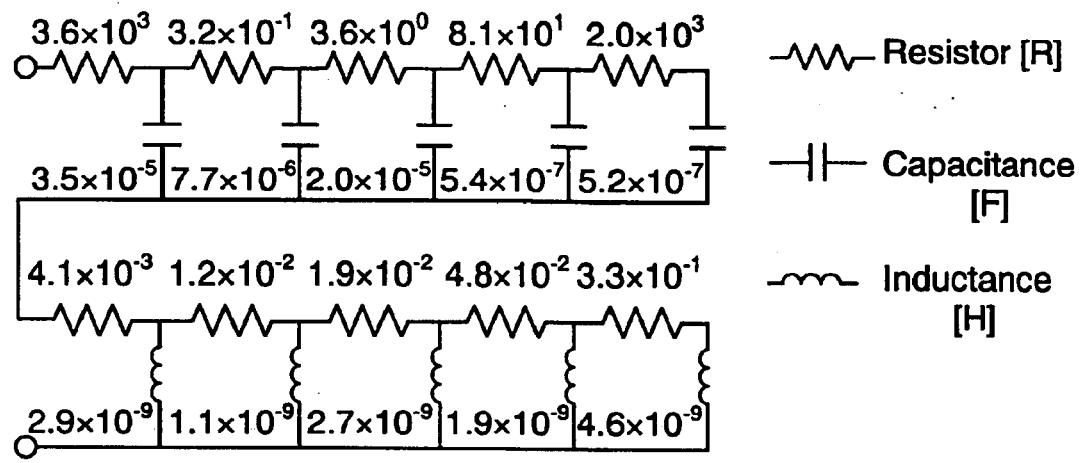
FIG. 6A is a diagram showing an equivalent circuit model of conventional art.
Figure 6B:
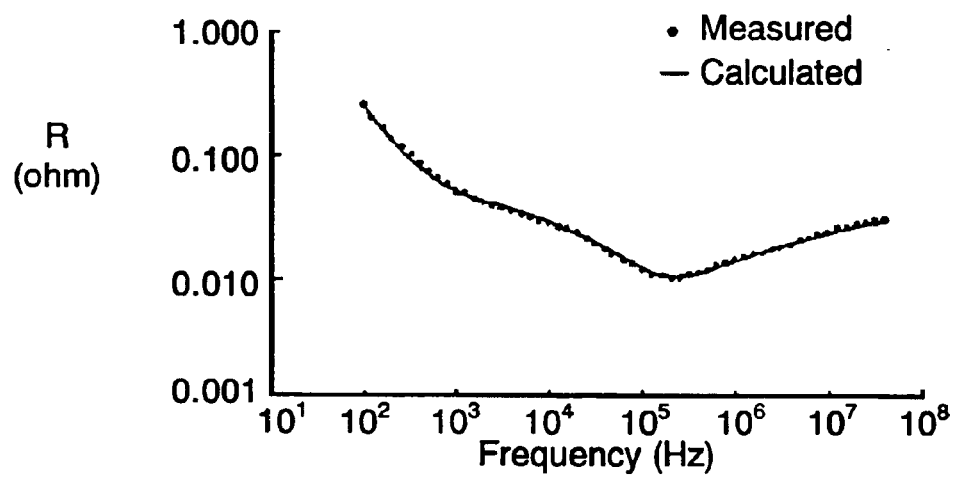
FIG. 6B is a characteristic diagram of the real parts of impedances of the conventional art and the exemplary embodiment of the present invention.
Figure 6C:
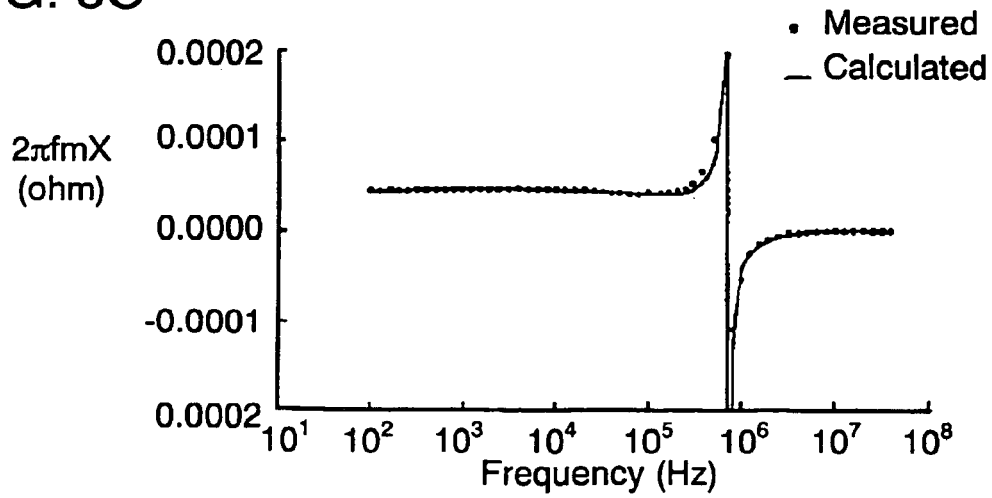
FIG. 6C is a characteristic diagram of the imaginary parts of impedances.
Figure 7:
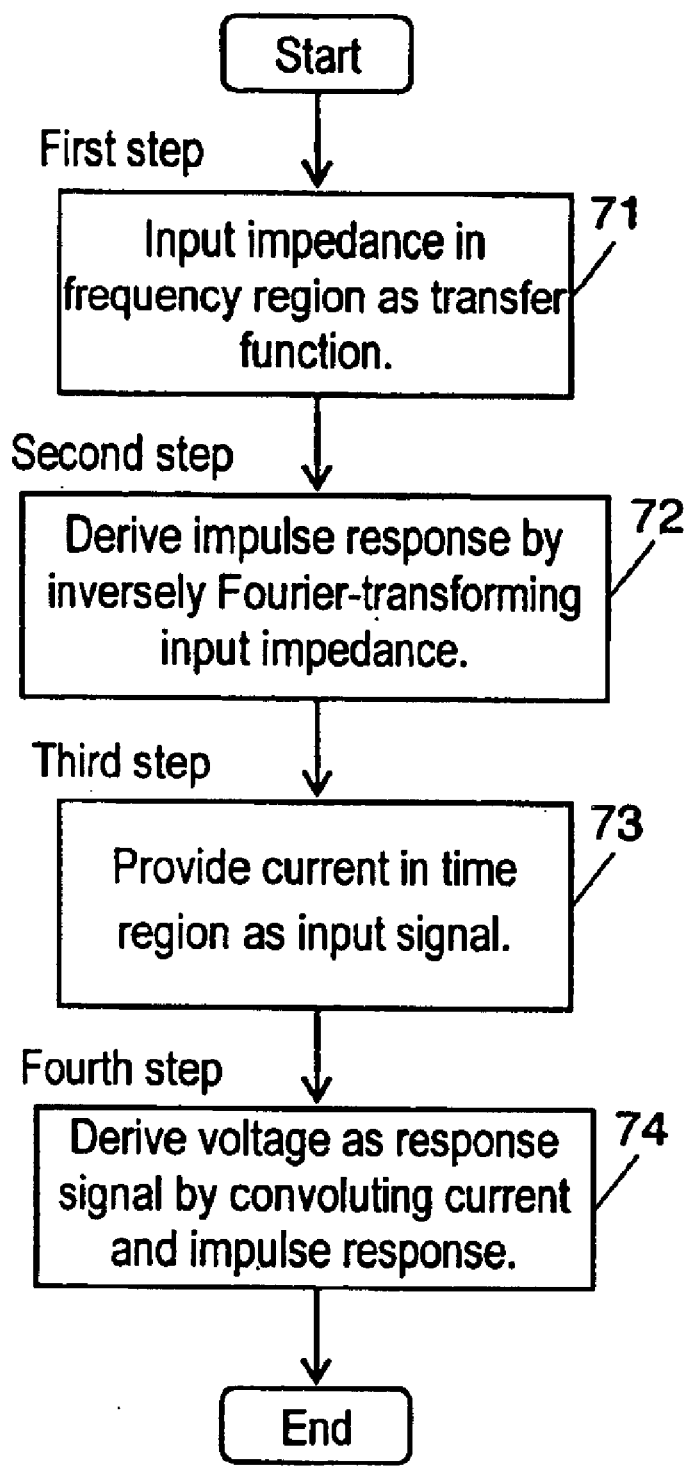
FIG. 7 is a processing flow chart of a transient response analysis of conventional art.

Accuracy of the result obtained by the transient response analysis by convolution can be compared with that of the transient response analysis by the SPICE using the equivalent circuit model. FIG. 6A shows the equivalent circuit model of the aluminum solid electrolytic capacitor. This equivalent circuit model accurately indicates impedance characteristics measured in the frequency region as shown in FIG. 6B and FIG. 6C. The result obtained by the transient response analysis by convolution, as shown in FIG. 5, sufficiently fits to the result of the transient response analysis by the SPICE using the equivalent circuit model, and can ensure high accuracy.

The transient response analysis program can be applied to not only the capacitor but also a passive component such as a resistor or an inductor and a composite component formed by combining them, and has an effect especially in a transient response analysis of a component including the capacitor.

The transient response analysis program of the capacitor of the present invention uses, instead of $R_0$ having the relation of Eq. 8, $R_0$ for which $z_R(t_m)$ in Eq. 9 matching with $z_x(t_m)$ expressed by $$z_x(t_m) = \frac{m}{4NC_0 f_N} - \frac{1}{2N} \sum_{\substack{n=-N\\n\neq 0}}^{N-1} X\left(\frac{nf_N}{N}\right) \sin\left(\frac{\pi mn}{N}\right) \tag{27}$$

for m satisfying m≠0 or $R_0$ satisfying at least Eq. 12. This program can further increase accuracy of the transient response analysis of the capacitor.

In other words, instead of the extrapolated value of the real part of the impedance at zero frequency that is used in the fifth step of the transient response analysis program of the capacitor, $R_0$ is set focusing attention on causality of the capacitor as the passive element. Here, the causality means a property where a response signal does not occur before occurrence of an input signal. $R_0$ is set by the following method.

It is generally known that the real part and the imaginary part of transfer function $Z(\omega)=R(\omega)+jX(\omega)$ of a system having the causality satisfy Kramers-Kronig relations $$R(\omega) - R_{min} = \frac{P}{\pi} \int_{-\infty}^{\infty} \frac{X(y)}{\omega - y} dy \tag{28}$$

$$X(\omega) = -\frac{P}{\pi} \int_{-\infty}^{\infty} \frac{R(y) - R_{min}}{\omega - y} dy,$$

where, $R_{min}$ is the constant part of $R(\omega)$, and P means principal value integration.

Assuming inverse Fourier transformation of $Z(\omega)-R_{min}$, $R(\omega)-R_{min}$, and $X(\omega)$ provides $z'(t)$, $z'_R(t)$, and $z_x(t)$, respectively, and using step function $$U(t) = \begin{cases} 1 & (0 < t) \\ 1/2 & (t = 0) \\ 0 & (t < 0) \end{cases}, \tag{29}$$

equation $$z'(t) = 2U(t)z'_R(t) = 2U(t)z_x(t) \tag{30}$$

is known to hold. Details are described in "Analog and digital signal analysis" second edition, 229 pages, A. Paporis Gendai Kougakusha, for example. From Eq. 30, it is found that $$z'_R(t)=z_R(t)-R_{min}\delta(t,0)=z_X(t) \quad (31)$$

holds at $t \geq 0$, where $\delta(t,0)$ is Dirac's delta-function.

Therefore, from Eq. 31, $R_0$ is set to match $z_R(t_m)$ in Eq. 22 with $z_x(t_m)$ in Eq. 27 or at least to satisfy $$0.9 \times z_X(t_m) \leq z_R(t_m) \leq 1.1 \times z_X(t_m) \quad (32)$$

for m satisfying m≠0.

The range shown by Eq. 32 gives a similar meaning to the case of Eq. 21. Using $R_0$ calculated in the method discussed above increases accuracy of the transient response analysis, especially when the impedance increases rapidly near zero frequency.

In the fifth step of the transient response analysis program of the capacitor of the present invention, instead of $R_0$ having the relation of Eq. 21, $R_0$ shown below is used. In other words, for N' satisfying $$X(f_{N'}) \leq 0 < X(f_{N'+1}) \quad (33)$$

and m satisfying m≠0 and $|m| \leq N'$, $R_0$ matching the impulse response of X every sample time expressed by $$z_x(t_m) = \frac{m}{4N'C_0 f_{N'}} - \frac{1}{2N'} \sum_{\substack{n=-N' \\ n \neq 0}}^{N'-1} X\left(\frac{nf_{N'}}{N'}\right) \sin\left(\frac{\pi m n}{N'}\right) \quad (34)$$

with the impulse response of R every sample time expressed by $$z_R(t_m) = \frac{R_0}{2N'} + \frac{1}{2N'} \sum_{\substack{n=-N' \\ n \neq 0}}^{N'-1} R\left(\frac{nf_{N'}}{N'}\right) \cos\left(\frac{\pi m n}{N'}\right) \quad (35)$$

or $R_0$ satisfying at least $$0.9 \times z_X(t_m) \leq z_R(t_m) \leq 1.1 \times z_X(t_m) \quad (36)$$

is used. $R_0$ can be easily determined by removing a high-frequency component of $X(f_n)$.

In other words, in deriving $z_x(t_m)$ using Eq. 27, the high-frequency component of $X(f_n)$ causes vibration of $z_x(t_m)$ in a small cycle, and hence it becomes difficult that $R_0$ satisfying Eq. 32 is set by comparing $z_R(t_m)$ with $z_x(t_m)$. However, removing the high-frequency component of $X(f_n)$ can facilitate derivation of $R_0$.

The range shown by Eq. 36 gives a similar meaning to the case of Eq. 21.

In the sixth step of the transient response analysis program of the capacitor of the present invention, using constant Rs matching with minimum value $R_{min}$ of $R(f_n)$ or Rs satisfying $$0.9 \times R_{min} \leq R_s \leq 1.1 \times R_{min}, \quad (17)$$

an impulse response of R every sample time expressed by $$z_R(t_m) = z_X(t_m) + \frac{NR_S}{f_N} \delta_{m,0} \quad (18)$$

$$\delta(m,0) = \begin{cases} 1(m=0) \\ 0(m \neq 0) \end{cases}$$

is generated, instead of impulse response $z_R$ of the real part of the impedance generated by Eq. 22. Even when this method is used, $z_R$ generated by Eq. 22 in the sixth step can be derived.

The range shown by Eq. 17 gives a similar meaning to the case of Eq. 21.

The present invention provides a computer-readable recording medium for storing the program for executing the transient response analysis of the capacitor. The program can be executed in the computer using the recording medium.

The present invention provides an analyzing method of the transient response analysis of the capacitor using the program. This method allows increase of analyzing accuracy of the transient response of the capacitor.

The present invention provides a simulator including a function of finding a transient response of the capacitor based on the analyzing method of the transient response analysis of the capacitor using the program. This simulator allows highly accurate transient response analysis of the capacitor.

As discussed above, the present invention provides a program for making a computer execute a transient response analysis of a capacitor having impedance in a positive frequency region. This program includes at least nine steps. Especially, impedances at zero frequency are estimated from respective impedances in positive and negative frequency regions, and the obtained result is reflected on the transient response analysis, thereby increasing the analyzing accuracy.

Industrial Applicability

The present invention relates to a transient response analysis technology of a capacitor, and more specifically to a program for making a computer execute a transient response analysis of the capacitor. The object of the present invention is to increase accuracy of the transient response analysis of the capacitor.

What is claimed is:

1. A method of performing a transient response analysis of a capacitor having an impedance in a positive frequency region, wherein the transient response analysis comprises at least the steps of:

firstly, inputting an impedance every positive sample frequency expressed by $$Z(f_n)=R(f_n)+jX(f_n) \quad (1)$$

where Z is an impedance, R is real part of Z, X is imaginary part of Z, j is imaginary unit, n ($1 \leq n \leq N$) is an integer, and $f_n$ ($f_n = nf_N/N$) is a sample frequency;

secondly, generating an impedance every negative sample frequency expressed by $$Z(f_{-n})=R(f_n)-jX(f_n); \quad (2)$$

thirdly, for an impulse response of Z every sample time expressed by $$z(t_m)=z_R(t_m)+z_X(t_m) \quad (3)$$

where, z is an impulse response of Z, $z_R$ is an impulse response of R, $z_X$ is an impulse response of X, m ($0 \leq m \leq N$) is an integer, and $t_m$ ($t_m = m/2f_N$) is a sample time, and for a capacitance at the lowest sample frequency expressed by $$\tilde{C}_0 = \frac{-1}{2\pi f_1 X(f_1)}, \quad (4)$$

setting capacitance $C_0$ so as to equal to $\tilde{C}_0$ or at least so as to satisfy $$0.9 \times \tilde{C}_0 \leq C_0 \leq 1.1 \times \tilde{C}_0; \qquad (5)$$

fourthly, generating an impulse response of X every sample time expressed by $$z_x(t_m) = \frac{m}{4NC_0 f_N} - \frac{1}{2N} \sum_{\substack{n=-N \\ n \neq 0}}^{N-1} X\left(\frac{nf_N}{N}\right) \sin\left(\frac{\pi mn}{N}\right); \qquad (6)$$

fifthly, for an extrapolated value of the real part of the impedance at zero frequency expressed by $$\tilde{R}_0 = \frac{f_2 R(f_1) - f_1 R(f_2)}{f_2 - f_1} \qquad (7)$$

setting direct-current resistance $R_0$ so as to be equal to $\tilde{R}_0$ or at least so as to satisfy $$0.9 \times \tilde{R}_0 \leq R_0 \leq 1.1 \times \tilde{R}_0; \qquad (8)$$

sixthly, generating an impulse response of R every sample time expressed by $$z_R(t_m) = \frac{R_0}{2N} + \frac{1}{2N} \sum_{\substack{n=-N \\ n \neq 0}}^{N-1} R\left(\frac{nf_N}{N}\right) \cos\left(\frac{\pi mn}{N}\right); \qquad (9)$$

seventhly, inputting an input current every sample time expressed by $$i(t_m); \qquad (10)$$

eighthly, generating a response voltage every sample time expressed by $$v(t_m) = \sum_{m'=-N}^{N-1} z\left(\frac{m'}{2f_N}\right) i\left(\frac{m-m'}{2f_N}\right); \qquad (11)$$

and ninthly, outputting at least part of data obtained using Eq. 1 to Eq. 11.

2. A method according to claim 1, wherein, in the fifth step, instead of $R_0$ having the relation of Eq. 8, $R_0$ matching $z_R(t_m)$ in Eq. 9 with $z_x(t_m)$ in Eq. 6 or $R_0$ satisfying at least $$0.9 \times z_X(t_m) \leq z_R(t_m) \leq 1.1 \times z_X(t_m), \qquad (12)$$

for m satisfying m≠0 is used.

3. A method according to claim 1, wherein, in the fifth step, instead of $R_0$ having the relation of Eq. 8, for N' satisfying $$X(f_{N'}) \leq 0 \leq X(f_{N'+1}) \qquad (13)$$

and for m satisfying m≠0 and $|m| \leq N'$, $R_0$ matching an impulse response of X every sample time expressed by $$z_x(t_m) = \frac{m}{4N'C_0 f_{N'}} - \frac{1}{2N'} \sum_{\substack{n=-N' \\ n \neq 0}}^{N'-1} X\left(\frac{nf_{N'}}{N'}\right) \sin\left(\frac{\pi mn}{N'}\right) \qquad (14)$$

with an impulse response of R every sample time expressed by $$z_R(t_m) = \frac{R_0}{2N'} + \frac{1}{2N'} \sum_{\substack{n=-N' \\ n \neq 0}}^{N'-1} R\left(\frac{nf_{N'}}{N'}\right) \cos\left(\frac{\pi mn}{N'}\right) \qquad (15)$$

or $R_0$ satisfying at least $$0.9 \times z_X(t_m) \leq z_R(t_m) \leq 1.1 \times z_X(t_m), \qquad (12)$$

is used.

4. A method according to claim 1, wherein, in the sixth step, using constant Rs matching with minimum value $R_{min}$ of $R(f_n)$ or Rs satisfying at least $$0.9 \times R_{min} \leq R_S \leq 1.1 \times R_{min}, \qquad (17)$$

an impulse response of R every sample time expressed by $$z_R(t_m) = z_X(t_m) + \frac{NR_S}{f_N} \delta_{m,0} \qquad (18)$$

$$\delta(m, 0) = \begin{cases} 1(m = 0) \\ 0(m \neq 0) \end{cases}$$

is generated, instead of impulse response $z_R$ of the real part of the impedance generated by Eq. 9.

5. A computer-readable recording medium for storing a program to perform a method of performing a transient response analysis of a capacitor having an impedance in a positive frequency region, wherein the transient response analysis comprises at least the steps of:

firstly, inputting an impedance every positive sample frequency expressed by $$Z(f_n) = R(f_n) + jX(f_n) \qquad (1)$$

where Z is an impedance, R is real part of Z, X is imaginary part of Z, j is imaginary unit, n ($1 \leq n \leq N$) is an integer, and $f_n$ ($f_n = nf_N/N$) is a sample frequency;

secondly, generating an impedance every negative sample frequency expressed by $$Z(f_{-n}) = R(f_n) - jX(f_n); \qquad (2)$$

thirdly, for an impulse response of Z every sample time expressed by $$z(t_m) = z_R(t_m) + z_x(t_m) \qquad (3)$$

where, z is an impulse response of Z, $z_R$ is an impulse response of R, $z_X$ is an impulse response of X, m ($0 \leq m \leq N$) is an integer, and $t_m$ ($t_m = m/2f_N$) is a sample time, and for a capacitance at the lowest sample frequency expressed by $$\tilde{C}_0 = \frac{-1}{2\pi f_1 X(f_1)}, \qquad (4)$$

setting capacitance $C_0$ so as to equal to $\tilde{C}_0$ or at least so as to satisfy $$0.9 \times \tilde{C}_0 \leq C_0 \leq 1.1 \times \tilde{C}_0; \qquad (5)$$

fourthly, generating an impulse response of X every sample time expressed by $$z_x(t_m) = \frac{m}{4NC_0 f_N} - \frac{1}{2N} \sum_{\substack{n=-N \\ n \neq 0}}^{N-1} X\left(\frac{nf_N}{N}\right) \sin\left(\frac{\pi mn}{N}\right); \quad (6)$$

fifthly, for an extrapolated value of the real part of the impedance at zero frequency expressed by $$\tilde{R}_0 = \frac{f_2 R(f_1) - f_1 R(f_2)}{f_2 - f_1} \quad (7)$$

setting direct-current resistance $R_0$ so as to be equal to $\tilde{R}_0$ or at least so as to satisfy $$0.9 \times \tilde{R}_0 \leq R_0 \leq 1.1 \times \tilde{R}_0; \quad (8)$$

sixthly, generating an impulse response of R every sample time expressed by $$z_R(t_m) = \frac{R_0}{2N} + \frac{1}{2N} \sum_{\substack{n=-N \\ n \neq 0}}^{N-1} R\left(\frac{nf_N}{N}\right) \cos\left(\frac{\pi mn}{N}\right); \quad (9)$$

seventhly, inputting an input current every sample time expressed by $$i(t_m); \quad (10)$$

eighthly, generating a response voltage every sample time expressed by $$v(t_m) = \sum_{m'=-N}^{N-1} z\left(\frac{m'}{2f_N}\right) i\left(\frac{m-m'}{2f_N}\right); \quad (11)$$

and ninthly, outputting at least part of data obtained using Eq. 1 to Eq. 11.

6. A method of performing a transient response analysis according to claim 1 wherein said method is executed on a computer by a program.

7. A simulator including a function of deriving a transient response analysis of a capacitor having an impedance in a positive frequency region, wherein the transient response analysis comprises at least the steps of:

firstly, inputting an impedance every positive sample frequency expressed by $$Z(f_n) = R(f_n) + jX(f_n) \quad (1)$$

where Z is an impedance, R is real part of Z, X is imaginary part of Z, j is imaginary unit, n ($1 \leq n \leq N$) is an integer, and $f_n$ ($f_n = nf_N/N$) is a sample frequency;

secondly, generating an impedance every negative sample frequency expressed by $$Z(f_{-n}) = R(f_n) - jX(f_n); \quad (2)$$

thirdly, for an impulse response of Z every sample time expressed by $$z(t_m) = z_R(t_m) + z_x(t_m) \quad (3)$$

where, z is an impulse response of Z, $z_R$ is an impulse response of R, $z_x$ is an impulse response of X, m ($0 \leq m \leq N$) is an integer, and $t_m$ ($t_m = m/2f_N$) is a sample time, and for a capacitance at the lowest sample frequency expressed by $$\tilde{C}_0 = \frac{-1}{2\pi f_1 X(f_1)}, \quad (4)$$

setting capacitance $C_0$ so as to equal to $\tilde{C}_0$ or at least so as to satisfy $$0.9 \times \tilde{C}_0 \leq C_0 \leq 1.1 \times \tilde{C}_0; \quad (5)$$

fourthly, generating an impulse response of X every sample time expressed by $$z_x(t_m) = \frac{m}{4NC_0 f_N} - \frac{1}{2N} \sum_{\substack{n=-N \\ n \neq 0}}^{N-1} X\left(\frac{nf_N}{N}\right) \sin\left(\frac{\pi mn}{N}\right); \quad (6)$$

fifthly, for an extrapolated value of the real part of the impedance at zero frequency expressed by $$\tilde{R}_0 = \frac{f_2 R(f_1) - f_1 R(f_2)}{f_2 - f_1} \quad (7)$$

setting direct-current resistance $R_0$ so as to be equal to $\tilde{R}_0$ or at least so as to satisfy $$0.9 \times \tilde{R}_0 \leq R_0 \leq 1.1 \times \tilde{R}_0; \quad (8)$$

sixthly, generating an impulse response of R every sample time expressed by $$z_R(t_m) = \frac{R_0}{2N} + \frac{1}{2N} \sum_{\substack{n=-N \\ n \neq 0}}^{N-1} R\left(\frac{nf_N}{N}\right) \cos\left(\frac{\pi mn}{N}\right); \quad (9)$$

seventhly, inputting an input current every sample time expressed by $$i(t_m); \quad (10)$$

eighthly, generating a response voltage every sample time expressed by $$v(t_m) = \sum_{m'=-N}^{N-1} z\left(\frac{m'}{2f_N}\right) i\left(\frac{m-m'}{2f_N}\right); \quad (11)$$

and ninthly, outputting at least part of data obtained using Eq. 1 to Eq. 11.

8. A computer-readable recording medium according to claim 5, wherein, in the fifth step, instead of $R_0$ having the relation of Eq. 8, $R_0$ matching $z_R(t_m)$ in Eq. 9 with $z_x(t_m)$ in Eq. 6 or $R_0$ satisfying at least $$0.9 \times z_x(t_m) \leq z_R(t_m) \leq 1.1 \times z_x(t_m), \quad (12)$$

for m satisfying m≠0 is used.

9. A computer-readable recording medium according to claim 5, wherein, in the fifth step, instead of $R_0$ having the relation of Eq. 8, for N' satisfying $$X(f_{N'}) \leq 0 < X(f_{N'+1}) \quad (13)$$

and for m satisfying $m \neq 0$ and $|m| \leq N'$, $R_0$ matching an impulse response of X every sample time expressed by $$z_x(t_m) = \frac{m}{4N'C_0 f_{N'}} - \frac{1}{2N'} \sum_{\substack{n=-N' \\ n \neq 0}}^{N'-1} X\left(\frac{nf_{N'}}{N'}\right) \sin\left(\frac{\pi mn}{N'}\right) \quad (14)$$

with an impulse response of R every sample time expressed by $$z_R(t_m) = \frac{R_0}{2N'} + \frac{1}{2N'} \sum_{\substack{n=-N' \\ n \neq 0}}^{N'-1} R\left(\frac{nf_{N'}}{N'}\right) \cos\left(\frac{\pi mn}{N'}\right) \quad (15)$$

or $R_0$ satisfying at least $$0.9 \times z_X(t_m) \leq z_R(t_m) \leq 1.1 \times z_X(t_m), \quad (12)$$

is used.

10. A computer-readable recording medium according to claim 5,
wherein, in the sixth step, using constant Rs matching with minimum value $R_{min}$ of $R(f_n)$ or Rs satisfying at least $$0.9 \times R_{min} \leq R_s \leq 1.1 \times R_{min}, \quad (17)$$

an impulse response of R every sample time expressed by $$z_R(t_m) = z_X(t_m) + \frac{NR_S}{f_N} \delta_{m,0} \quad (18)$$

$$\delta(m, 0) = \begin{Bmatrix} 1(m=0) \\ 0(m \neq 0) \end{Bmatrix}$$

is generated, instead of impulse response $Z_R$ of the real part of the impedance generated by Eq. 9.

11. A method of performing a transient response analysis according to claim 2, wherein said method is executed on a computer by a program.

12. A method of performing a transient response analysis according to claim 3, wherein said method is executed on a computer by a program.

13. A method of performing a transient response analysis according to claim 4, wherein said method is executed on a computer by a program.

14. A simulator according to claim 7,
wherein, in the fifth step, instead of $R_0$ having the relation of Eq. 8, $R_0$ matching $z_R(t_m)$ in Eq. 9 with $z_x(t_m)$ in Eq. 6 or $R_0$ satisfying at least $$0.9 \times z_X(t_m) \leq z_R(t_m) \leq 1.1 \times z_X(t_m), \quad (12)$$

for m satisfying $m \neq 0$ is used.

15. A simulator according to claim 7,
wherein, in the fifth step, instead of $R_0$ having the relation of Eq. 8, for N' satisfying $$X(f_{N'}) \leq 0 \leq X(f_{N'+1}) \quad (13)$$

and for m satisfying $m \neq 0$ and $|m| \leq N'$, $R_0$ matching an impulse response of X every sample time expressed by $$z_x(t_m) = \frac{m}{4N'C_0 f_{N'}} - \frac{1}{2N'} \sum_{\substack{n=-N' \\ n \neq 0}}^{N'-1} X\left(\frac{nf_{N'}}{N'}\right) \sin\left(\frac{\pi mn}{N'}\right) \quad (14)$$

with an impulse response of R every sample time expressed by $$z_R(t_m) = \frac{R_0}{2N'} + \frac{1}{2N'} \sum_{\substack{n=-N' \\ n \neq 0}}^{N'-1} R\left(\frac{nf_{N'}}{N'}\right) \cos\left(\frac{\pi mn}{N'}\right) \quad (15)$$

or $R_0$ satisfying at least $$0.9 \times z_X(t_m) \leq z_R(t_m) \leq 1.1 \times z_X(t_m), \quad (12)$$

is used.

16. A simulator according to claim 7,
wherein, in the sixth step, using constant Rs matching with minimum value $R_{min}$ of $R(f_n)$ or Rs satisfying at least $$0.9 \times R_{min} \leq R_s \leq 1.1 \times R_{min}, \quad (17)$$

an impulse response of R every sample time expressed by $$z_R(t_m) = z_X(t_m) + \frac{NR_S}{f_N} \delta_{m,0} \quad (18)$$

$$\delta(m, 0) = \begin{Bmatrix} 1(m=0) \\ 0(m \neq 0) \end{Bmatrix}$$

is generated, instead of impulse response $Z_R$ of the real part of the impedance generated by Eq. 9.

* * * * *

UNITED STATES PATENT AND TRADEMARK OFFICE
CERTIFICATE OF CORRECTION

| | | |
|---|---|---|
| PATENT NO. | : 6,873,922 B2 | Page 1 of 1 |
| APPLICATION NO. | : 10/490263 | |
| DATED | : March 29, 2005 | |
| INVENTOR(S) | : Hiroyuki Maeshima | |

It is certified that error appears in the above-identified patent and that said Letters Patent is hereby corrected as shown below:

Cover Page

Item [87] PCT Pub. No, "WO2004/011931" should read -- WO2004/011951 --.

Column 9

Line 57, "$X(f_{N'}) \leq 0 \leq X(f_{N'+1})$" should read -- $X(f_{N'}) \leq 0 < X(f_{N'+1})$ --.

Signed and Sealed this

Twentieth Day of February, 2007

JON W. DUDAS
*Director of the United States Patent and Trademark Office*